United States Patent
Ley et al.

(10) Patent No.: US 11,977,757 B2
(45) Date of Patent: May 7, 2024

(54) REAL TIME PROFILE SWITCHING FOR MEMORY OVERCLOCKING

(71) Applicant: Advanced Micro Devices, Inc., Santa Clara, CA (US)

(72) Inventors: Grant Evan Ley, Eden, UT (US); Jayesh Hari Joshi, Austin, TX (US); Amitabh Mehra, Fort Collins, CO (US); Jerry Anton Ahrens, Sister Bay, WI (US); Joshua Taylor Knight, Georgetown, TX (US); Anil Harwani, Austin, TX (US); William Robert Alverson, Del Valle, TX (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 0 days.

(21) Appl. No.: 17/732,718

(22) Filed: Apr. 29, 2022

(65) Prior Publication Data
US 2023/0350591 A1 Nov. 2, 2023

(51) Int. Cl.
*G06F 3/06* (2006.01)

(52) U.S. Cl.
CPC .......... *G06F 3/0634* (2013.01); *G06F 3/0604* (2013.01); *G06F 3/0613* (2013.01); *G06F 3/0673* (2013.01)

(58) Field of Classification Search
CPC .... G06F 3/0604; G06F 3/0613; G06F 3/0634; G06F 3/0673; G06F 3/061; G06F 3/0679; G11C 7/22; G11C 29/023; G11C 29/028; G11C 29/50012; G11C 2207/2254
See application file for complete search history.

(56) References Cited

U.S. PATENT DOCUMENTS

| 7,382,366 B1 | 6/2008 | Klock et al. |
| 9,360,909 B2 | 6/2016 | Wells et al. |
| 10,466,737 B2 | 11/2019 | Han |
| 10,904,086 B1 | 1/2021 | Varia et al. |

(Continued)

FOREIGN PATENT DOCUMENTS

WO 2023211606 A1 11/2023

OTHER PUBLICATIONS

U.S. Appl. No. 17/708,453 , "Final Office Action", U.S. Appl. No. 17/708,453, dated Jul. 20, 2023, 12 pages.

(Continued)

*Primary Examiner* — Larry T Mackall
(74) *Attorney, Agent, or Firm* — FIG. 1 Patents

(57) ABSTRACT

Profile switching for memory overclocking is described. In accordance with the described techniques, a memory is operated according to a first memory profile. During operation of the memory according to the first memory profile, a request is received to operate the memory according to a second memory profile. Responsive to the request, operation of the memory is switched to operate according to the second memory profile without rebooting. In one or more implementations, at least one of the first memory profile or the second memory profile comprises an overclocking memory profile that configures the memory to operate in an overclocking mode. In one or more implementations, the memory is trained to operate according to the overclocking memory profile prior to operating the memory according to the first memory profile.

20 Claims, 7 Drawing Sheets

(56) References Cited

U.S. PATENT DOCUMENTS

| | | |
|---|---|---|
| 11,262,924 B2 | 3/2022 | Alverson et al. |
| 11,835,998 B2 | 12/2023 | Mehra et al. |
| 2003/0097602 A1 | 5/2003 | Bigbee et al. |
| 2006/0149975 A1 | 7/2006 | Rotem et al. |
| 2007/0106428 A1 | 5/2007 | Omizo et al. |
| 2008/0114973 A1 | 5/2008 | Norton et al. |
| 2008/0276026 A1 | 11/2008 | Branover et al. |
| 2011/0040902 A1* | 2/2011 | Housty ............... G06F 11/3037 710/61 |
| 2011/0231637 A1 | 9/2011 | Schuette |
| 2014/0095904 A1 | 4/2014 | Ananthakrishnan et al. |
| 2014/0136823 A1 | 5/2014 | Ragland et al. |
| 2016/0282919 A1 | 9/2016 | Wells et al. |
| 2019/0079806 A1 | 3/2019 | Ragland et al. |
| 2020/0097201 A1 | 3/2020 | Irshad et al. |
| 2020/0192420 A1* | 6/2020 | Irshad ..................... G09G 5/39 |
| 2020/0364041 A1 | 11/2020 | Bulusu et al. |
| 2023/0315191 A1 | 10/2023 | Alverson et al. |
| 2023/0324947 A1 | 10/2023 | Mehra et al. |
| 2023/0350696 A1 | 11/2023 | Harwani et al. |

OTHER PUBLICATIONS

PCT/US2023/062509, "International Search Report and Written Opinion", PCT Application No. PCT/US2023/062509, dated May 26, 2023, 10 pages.

U.S. Appl. No. 17/708,453, "Non-Final Office Action", U.S. Appl. No. 17/708,453, dated Mar. 14, 2023, 11 pages.

U.S. Appl. No. 17/708,453, "Non-Final Office Action", U.S. Appl. No. 17/708,453, dated Sep. 8, 2023, 13 pages.

PCT/US2023/016453, "International Search Report and Written Opinion", PCT Application No. PCT/US2023/016453, dated Jul. 12, 2023, 11 pages.

U.S. Appl. No. 17/732,741, "Non-Final Office Action", U.S. Appl. No. 17/732,741, Jan. 2, 2024, 11 pages.

Rodrigue, Wayne Paul, et al., "Pursuant to MPEP § 2001.06(b) the applicant brings the following co-pending application to the Examiner's attention:", U.S. Appl. No. 18/399,052, Dec. 28, 2023, 52 pages.

U.S. Appl. No. 17/708,453, "Final Office Action", U.S. Appl. No. 17/708,453, Mar. 1, 2024, 14 pages.

\* cited by examiner

REAL TIME PROFILE SWITCHING FOR MEMORY OVERCLOCKING

BACKGROUND

Memory, such as random access memory (RAM), stores data that is used by the processor of a computing device. Performance of a memory generally depends on its operating frequency as well as its latency characteristics, which are often referred to as "timings". A memory can be "overclocked" by modifying specific parameters of the memory in order to achieve faster operating speeds which improves the performance of the computing device.

BRIEF DESCRIPTION OF THE DRAWINGS

The detailed description is described with reference to the accompanying figures.

DETAILED DESCRIPTION

Overview

Figure 1:
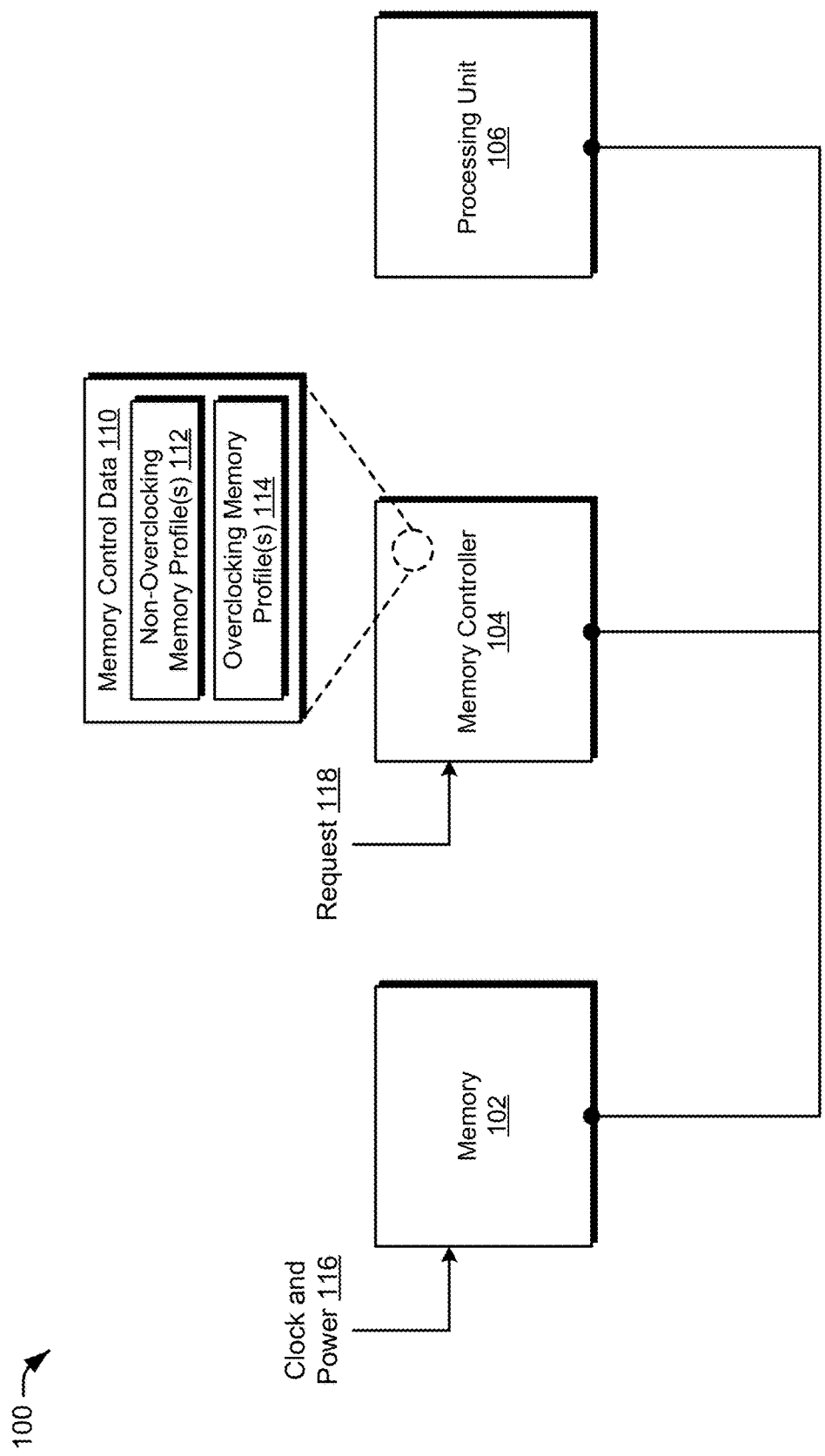
FIG. 1 is a block diagram of a non-limiting example system having a memory and a memory controller operable to implement real time profile switching for memory overclocking.

Conventional systems for overclocking a memory require a reboot of the system in order to retrain the memory to operate according to the modified settings and timing parameters of the overclocking mode. In many cases, the timings and settings of the memory are modified too aggressively by a user which results in a failure during the reboot.

To solve these problems, real time profile switching for memory overclocking is described. Unlike conventional systems, the described techniques enable a memory to transition from operating according to a standard operating mode to a more aggressive overclocking mode "on the fly" (e.g., in real time) without requiring a reboot of the system. To enable memory profile switching "on the fly," the memory is trained during a boot up process to operate according to multiple different memory profiles, and known good memory profiles are saved for later use by the memory. In some cases, the memory is trained to operate according to multiple different overclocking memory profiles, such as a high-bandwidth overclocking memory profile (e.g., for a productivity application), and a low latency overclocking memory profile (e.g., for gaming). By "pre-training" multiple different memory profiles, the need of conventional systems to "retrain" the memory profiles during a reboot in order to switch between memory profiles is eliminated. As such, the memory is able to dynamically switch between the different memory profiles in real time without rebooting the system which reduces boot failures caused by training the memory while also improving the end user experience associated with memory overclocking.

In some aspects, the techniques described herein relate to a method including: operating a memory according to a first memory profile; during operation of the memory according to the first memory profile, receiving a request to operate the memory according to a second memory profile; and responsive to the request, switching operation of the memory to operate according to the second memory profile without rebooting, wherein at least one of the first memory profile or the second memory profile includes an overclocking memory profile that configures the memory to operate in an overclocking mode.

In some aspects, the techniques described herein relate to a method, further including, prior to operating the memory according to the first memory profile, training the memory to operate according to the overclocking memory profile.

In some aspects, the techniques described herein relate to a method, wherein training the memory to operate according to the overclocking memory profile occurs during a boot up process.

In some aspects, the techniques described herein relate to a method, wherein the overclocking memory profile includes a high bandwidth overclocking memory profile.

In some aspects, the techniques described herein relate to a method, wherein the overclocking memory profile includes a low latency overclocking memory profile.

In some aspects, the techniques described herein relate to a method, wherein the second memory profile includes the overclocking memory profile.

In some aspects, the techniques described herein relate to a method, wherein the first memory profile includes the overclocking memory profile.

In some aspects, the techniques described herein relate to a method, wherein the second memory profile includes an additional overclocking memory profile.

In some aspects, the techniques described herein relate to a method including: training a memory to operate according to settings specified in multiple memory profiles, the multiple memory profiles including at least one overclocking memory profile; and causing display of a user interface that includes the multiple memory profiles, the user interface including controls to switch between the multiple memory profiles.

In some aspects, the techniques described herein relate to a method, wherein the multiple memory profiles include at least a non-overclocking memory profile, a high bandwidth overclocking memory profile, and a low latency overclocking memory profile.

In some aspects, the techniques described herein relate to a method, wherein training the memory to operate according to settings specified in multiple memory profiles occurs during a boot up process.

In some aspects, the techniques described herein relate to a method, further including: receiving, via the controls of the user interface, user input to select one of the multiple memory profiles; and causing the memory to switch from operating according to an active memory profile to operating according to a selected memory profile.

In some aspects, the techniques described herein relate to a method, wherein the memory switches from operating according to the active memory profile to operating according to the selected memory profile without rebooting.

In some aspects, the techniques described herein relate to a method, further including detecting, during the training, that the memory is not capable of operating according to at least one of the multiple memory profiles.

In some aspects, the techniques described herein relate to a method, further including displaying, in the user interface, a notification which visually indicates that the at least one of the multiple memory profiles failed the training.

In some aspects, the techniques described herein relate to a method, further including preventing operation of the memory according to the at least one of the multiple memory profiles.

In some aspects, the techniques described herein relate to a computing device including: a memory; and a memory controller configured to cause the memory to switch from operating according to a first memory profile to operating according to a second memory profile without rebooting the computing device, wherein at least one of the first memory profile or the second memory profile includes an overclocking memory profile.

In some aspects, the techniques described herein relate to a computing device, wherein the memory includes a double data rate 5 synchronous dynamic random-access memory.

In some aspects, the techniques described herein relate to a computing device, further including a processing unit that requests access to data from the memory.

In some aspects, the techniques described herein relate to a computing device, wherein the second memory profile includes the overclocking memory profile.

FIG. 1 is a block diagram of a non-limiting example system 100 having a memory and a memory controller operable to implement real time profile switching for memory overclocking. In particular, the system 100 includes memory 102, memory controller 104, and processing unit 106. In accordance with the described techniques, the memory 102, the memory controller 104, and the processing unit 106 are coupled to one another via a wired or wireless connection. Example wired connections include, but are not limited to, data communication buses connecting two or more of the memory 102, the memory controller 104, and the processing unit 106. Examples of devices in which the system 100 is configured for integration include, but are not limited to, servers, personal computers, laptops, desktops, game consoles, set top boxes, tablets, smartphones, mobile devices, virtual and/or augmented reality devices, wearables, medical devices, systems on chips, and other computing devices or systems.

The memory 102 is a device or system that is used to store information, such as for immediate use in a device. In one or more implementations, the memory 102 corresponds to semiconductor memory where data is stored within memory cells on one or more integrated circuits. In at least one example, the memory 102 corresponds to or includes volatile memory, examples of which include random-access memory (RAM), dynamic random-access memory (DRAM), and static random-access memory (SRAM). Alternatively or in addition, the memory 102 corresponds to or includes non-volatile memory, examples of which include flash memory, read-only memory (ROM), programmable read-only memory (PROM), erasable programmable read-only memory (EPROM), and electronically erasable programmable read-only memory (EEPROM).

In one or more implementations, the memory 102 is configured as a dual in-line memory module (DIMM). A DIMM includes a series of dynamic random-access memory integrated circuits, and the modules are mounted on a printed circuit board. Examples of types of DIMMs include, but are not limited to, synchronous dynamic random-access memory (SDRAM), double data rate (DDR) SDRAM, double data rate 2 (DDR2) SDRAM, double data rate 3 (DDR3) SDRAM, double data rate 4 (DDR4) SDRAM, and double data rate 5 (DDR5) SDRAM. In at least one variation, the memory 102 is configured as a small outline DIMM (SO-DIMM) according to one of the above-mentioned SDRAM standards, e.g., DDR, DDR2, DDR3, DDR4, and DDR5. It is to be appreciated that the memory 102 is configurable in a variety of ways without departing from the spirit or scope of the described techniques.

The memory controller 104 manages the memory 102, including the communication of data to and from the memory 102. For example, the memory controller 104 manages the communication of data to the memory 102 from the processing unit 106 and the communication of data from the memory 102 to the processing unit 106, e.g., over a coupling between the memory 102 and the processing unit 106. As discussed above and below, the memory controller 104 also trains the memory 102 (e.g., during a boot process) to operate according to settings (e.g., clock and/or power settings) specified in one or more memory profiles.

The processing unit 106 is a component that requests access to data from the memory 102 for performing one or more operations in relation to such data, e.g., in connection with executing an application (not shown). Examples of the processing unit include, but are not limited to, a central processing unit, a parallel accelerated processor (e.g., a graphics processing unit), a digital signal processor, a hardware accelerator, a microcontroller, or a system on chip, to name just a few.

In accordance with the described techniques, the memory controller 104 is illustrated having memory control data 110, which in this example includes one or more non-overclocking memory profiles 112 and one or more overclocking memory profiles 114. Based on those profiles, the memory controller 104 and/or another component of the system 100 (e.g., physical layer (PHY)) are configured to train the memory 102. For instance, the memory controller 104 and/or the other component of the system 100 (e.g., the physical layer) train the memory 102 prior to a request to switch in real time from one memory profile to another memory profile without rebooting, e.g., "on the fly." In at least one variation, for example, the memory controller 104 trains the memory 102 with the overclocking memory profiles 114 during a boot up process of the system 100. In one or more implementations, the memory controller 104 also trains the memory 102 with the non-overclocking memory profiles 112 along with training the overclocking memory profiles 114. For example, both the overclocking memory profiles 114 and the non-overclocking memory profiles 112 are trained during the boot up process of the system 100. Alternatively or in addition, the memory controller 104 is configured to train the memory 102 with one or more memory profiles during a different phase, such as while the system 100 is in a "sleeping" state.

In one or more implementations, the memory controller 104 trains the memory 102 with a profile by testing whether the memory 102 is capable of operating using settings specified in the profile. By way of example, and not limitation, the memory controller 104 trains the memory 102, at least in part, by running one or more algorithms for enabling data to be reliably written to and/or read from at least a portion of the memory 102 using the settings of the profile. Examples of such algorithms include, but are not limited to a write leveling algorithm, a multi-purpose register (MPR) pattern write algorithm, a read centering algorithm, and/or a write centering algorithm. It is to be appreciated that training the memory 102 with a memory profile includes more and/or different operations without departing from the spirit or scope of the described techniques.

If, based on the training, the memory controller 104 detects that it is capable of operating the memory 102 using the settings specified by a particular profile (i.e., the profile "passes" the training), then the memory controller 104 causes the particular profile to be available for operation of the system 100. By way of example, the memory controller 104 causes the memory 102 to operate using the settings of the particular profile (e.g., a default memory profile), or the memory controller 104 enables subsequent real time switching to the profile without rebooting, e.g., "on the fly."

As described herein, switching from one memory profile to another memory profile "on the fly" refers to adjusting the settings according to which the memory 102 operates in real time, so that the memory 102 subsequently operates with settings that are different (e.g., settings of a requested memory profile) without rebooting the memory 102 and/or the system 100. In other words, the memory 102 and/or the system 100 are not rebooted over a time period that spans over a first time when the memory 102 operates according to a first memory profile, a second time when the memory controller 104 causes the memory 102 switch to a second memory profile for operation, and a third time when the memory 102 operates according to the second memory profile. Training the memory 102 with multiple memory profiles during boot up, and also switching in real time from one memory profile to another memory profile without rebooting, contrasts with conventional techniques which switch from one memory profile to another by rebooting the system and by training the conventional system with only the other memory profile during the boot up, e.g., so that the conventional system can operate using the other memory profile. In other words, in a conventional system, a request to switch memory profiles is received, and the system reboots before the requested memory profile is used. In contrast, the techniques described herein receive a request to switch memory profiles, and responsive to this request dynamically switch to the requested memory profile without rebooting the system.

By way of contrast to the discussion above about "passing" the training, if, based on the training, the memory controller 104 detects that it is not capable of operating the memory 102 using the settings of a particular profile, then the memory controller 104 reports that the profile has failed the training, e.g., the memory controller 104 generates and/or communicates a notification indicating that the profile failed the training. In one or more implementations, the memory controller 104 also prevents the memory 102 from operating using a memory profile that fails the training.

As noted above, a memory profile specifies one or more settings according to which the memory 102 operates. In accordance with the described techniques, a non-overclocking memory profile 112 specifies settings for the memory 102 that do not exceed certified settings, e.g., a clock rate specified in a non-overclocking memory profile 112 does not exceed the clock rate certified by a manufacturer of the memory 102. In contrast, an overclocking memory profile 114 specifies at least one setting for the memory 102 that exceeds a certified setting, e.g., a clock rate specified in an overclocking memory profile 114 exceeds the clock rate certified by a manufacturer of the memory 102. Broadly, an overclocking memory profile 114 enables the memory 102 to operate in an overclocking mode.

The memory profiles (e.g., the non-overclocking memory profiles 112 and the overclocking memory profiles 114) are configured to specify a variety of settings for operating the memory 102 in one or more implementations, such as various clock and power settings. Example settings include, but are not limited to, a data rate (e.g., megatransfers per second), a number of cycles between sending a column address to memory and the beginning of data in a response (e.g., CAS or tCAS), a minimum number of clock cycles to open a row and access a column (e.g., tRCD), a measure of latency between issuing a precharge command to idle or close open row and an activate command to open a different row (e.g., tRP), a minimum number of clock cycles between a row active command and issuing a precharge command (e.g., tRAS), nominal power supply voltage (e.g., VDD), output stage drain power voltage (e.g., VDDQ), and programming power voltage (e.g., VPP). It is to be appreciated that one or more of the non-overclocking memory profiles 112 and the overclocking memory profiles 114 specify values for one or more of those settings and/or various other settings associated with operating memory without departing from the spirit or scope of the described techniques.

The illustrated example also depicts clock and power 116 inputs to the memory 102. In accordance with the described techniques, the memory controller 104 and/or another component is configured to set the clock and power 116 inputs to cause the memory 102 to operate according to a memory profile, e.g., one of the non-overclocking memory profiles 112 or one of the overclocking memory profiles 114. Additionally, the memory controller 104 and/or the other component is configured to adjust the clock and power 116 inputs to cause the memory 102 to switch in real time from operating according to a first memory profile to operating according to a second memory profile and, notably, without rebooting the memory 102 or the system 100. The memory controller 104 is able to adjust these inputs to operate according to a different memory profile because the memory 102 has been pretrained with the different memory profile, e.g., during the boot process.

For example, the memory controller 104 switches to a different memory profile by sending one or more change signals to a voltage generator (not shown) to adjust a supply voltage (e.g., VDD), such that the clock and power 116 inputs subsequently include the supply voltage as adjusted according to the change signals. Additionally or alternatively, the memory controller 104 sends a change signal to a reference clock generator (not shown) to change a frequency of a clock rate, such that the clock and power 116 inputs subsequently include a reference clock signal as adjusted according to the change signals. The memory controller 104 is operable to adjust the clock and power 116 inputs in various ways to produce the settings specified in a given memory profile for operating the memory 102.

In one or more implementations, the memory controller 104 causes a switch in real time from a first memory profile to a second memory profile without rebooting, e.g., where at least one of the first or second memory profiles is an overclocking memory profile 114, based on a request 118. The request 118 requests to switch to the second memory profile. In one example, the request 118 is based on user input. For instance, user input is received (e.g., via a user interaction or selection with a displayed element of a user interface) to activate the second memory profile. In another example, the request 118 is application based, such that an application (not shown) requests that the memory 102 activate the second memory profile for execution of the application. Alternatively or in addition, the request 118 is algorithm based, where the algorithm provides the request 118 based on workload parameters. In accordance with the described techniques, for instance, different profiles specify settings for different workloads (or for groups of workloads), such that switching in real time from one profile to a different profile without rebooting occurs based on parameters of the workloads. By way of example, a computer game requests that the memory 102 switch to operating according to a memory profile which specifies settings for low latency, or a productivity application (e.g., photo or video editing application) requests that the memory 102 switch to operating according to a memory profile which specifies settings for high bandwidth. In the context of training the memory 102 and switching between first and second memory profiles, consider the following discussion.

Figure 2:
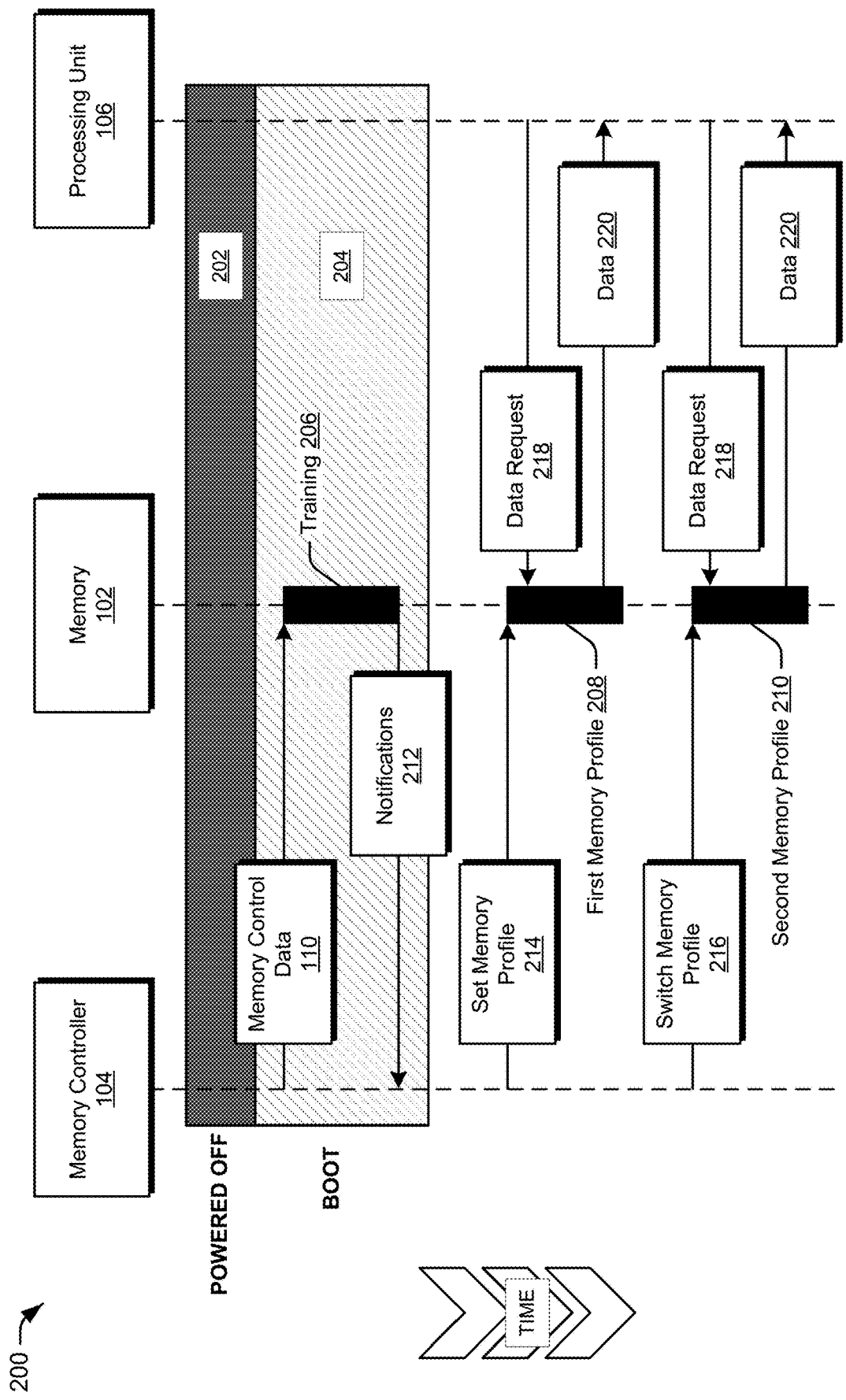
FIG. 2 depicts a non-limiting example in which the memory controller causes the memory to switch from operating according to a first memory profile to operating according to a second memory profile without rebooting.

FIG. 2 depicts a non-limiting example 200 in which the memory controller causes the memory to switch from operating according to a first memory profile to operating according to a second memory profile without rebooting. The example 200 includes from FIG. 1 the memory 102, the memory controller 104, and the processing unit 106.

The example 200 includes a variety of example communications and operations between the memory 102, the memory controller 104, and the processing unit 106 over time. In this example 200, the communications and operations are positioned vertically based on time (illustrated on the left hand portion of the example), such that communications and operations closer to a top of the example occur prior to communications or operations further from the top of the example. It follows also that communications or operations closer to a bottom of the example occur subsequent to communications or operations further from the bottom. The example 200 also depicts various phases and/or states of the system 100 or portions of the system 100. These phases and/or states are also positioned in the example 200 vertically based on time, such that phases or states closer to a top of the example occur prior to phases, states, or communications further from the top.

Here, the illustrated example 200 depicts a powered off phase 202 and a boot phase 204 of the system 100. During the powered off phase 202, the system 100 (and the memory 102) is powered off, examples of which include a soft off (e.g., G2/S5 state as specified by Advanced Configuration and Power Interface (ACPI)) and a mechanical off (e.g., G3 state as specified by ACPI), which require a reboot to return to a working state (e.g., G0/S0 state as specified by ACPI). During the boot phase 204, the system 100 performs various operations, such as hardware initializations, to advance the system 100 to a working state.

In accordance with the described techniques, the boot phase 204 includes training 206 of the memory 102. The illustrated example 200 depicts the memory controller 104 providing the memory control data 110 to the memory 102, e.g., for the training 206. By way of example, the memory controller 104 trains the memory 102 during the boot phase 204 with the memory control data 110, such as by training the memory 102 with one or more overclocking memory profiles 114. Additionally or alternatively, the memory controller 104 trains the memory 102 during the boot phase 204 with one or more non-overclocking memory profiles 112.

Notably, the memory controller 104 is configured to train the memory 102 with multiple memory profiles during the training 206. Training multiple memory profiles ahead of time (e.g., before the memory profiles are requested) enables the memory controller 104 to dynamically switch between the multiple trained memory profiles "on the fly," without rebooting.

In the context of the illustrated example 200, the multiple profiles with which the memory controller 104 trains the memory 102 include at least a first memory profile 208 and a second memory profile 210. Depending on outcomes of the training 206, the memory controller 104 makes the memory profiles with which the memory 102 is trained available for use during operation of the memory 102. The illustrated example 200 includes notifications 212, which are indicative of the memory 102's response to the training 206. In one or more implementations, the notifications 212 include signals indicating whether the training 206 with the settings of a given profile is successful. For example, the notifications 212 indicate for each of the multiple memory profiles whether they "passed" or "failed" the training 206. Since the memory 102 operates according to the first memory profile 208 and the second memory profile 210 in the illustrated example, it follows that the first memory profile 208 and the second memory profile 210 passed the training 206. In accordance with the described techniques, at least one of the first memory profile 208 or the second memory profile 210 corresponds to an overclocking memory profile 114.

Subsequent to the training 206, the memory controller 104 provides one or more set memory profile 214 signals to the memory 102 to cause the memory 102 to operate according to the first memory profile 208, in this example. Although the set memory profile 214 signal is depicted being provided subsequent to the boot phase 204 in this example 200, in one or more variations the memory controller 104 provides the set memory profile 214 signal during the boot phase 204. As mentioned above, the one or more signals can be provided to components of the system 100 (rather than directly to the memory 102), to set or adjust the clock and power 116 that is input to the memory 102.

Also in this example 200, the memory controller 104 provides one or more switch memory profile 216 signals to the memory 102 to cause the memory 102 to switch to operating according to the second memory profile 210. In accordance with the described techniques, the memory controller 104 causes the memory 102 to switch to operate according to the second memory profile 210 subsequent to having operated according to the first memory profile 208. Notably, the memory 102 is depicted in the example 200 operating according to the first memory profile 208 and switching to operate according to the second memory profile 210 without rebooting—there is no additional boot phase depicted while the memory 102 operates with the first memory profile 208, at the switch to the second memory profile 210, or while the memory 102 operates with the second memory profile 210.

The memory 102 is also depicted receiving data requests 218 from the processing unit 106 and providing data 220 to the processing unit 106 for servicing those requests, in accordance with the described techniques. In particular, the memory 102 receives one or more data requests 218 from the processing unit 106 and provides respective data 220 to the processing unit 106 while the memory 102 operates according to the first memory profile 208. The memory 102 also receives one or more data requests 218 from the processing unit 106 and provides respective data 220 to the processing unit 106 while the memory operates according to the second memory profile 210. In accordance with the described techniques, the memory controller 104 is further capable of causing the memory 102 to switch from operating according to the second memory profile 210 to operating according to the first memory profile 208 or according to any other profile with which the memory 102 was trained (and that passed) during the training 206.

As discussed above and below, the memory controller 104 causes the memory 102 to switch to operate according to a different memory profile, without rebooting, based on receiving the request 118 to switch. In one or more implementations, the request 118 specifies which trained memory profile to switch to. In the context of the example 200, for instance, the request 118 that causes the memory controller 104 to communicate the switch memory profile 216 signals specifies to switch to the second memory profile 210. In the context of displaying information about multiple memory profiles and enabling a user to request a memory profile according to which the memory 102 is to be operated, consider the following discussion of FIGS. 3-5.

Figure 3:
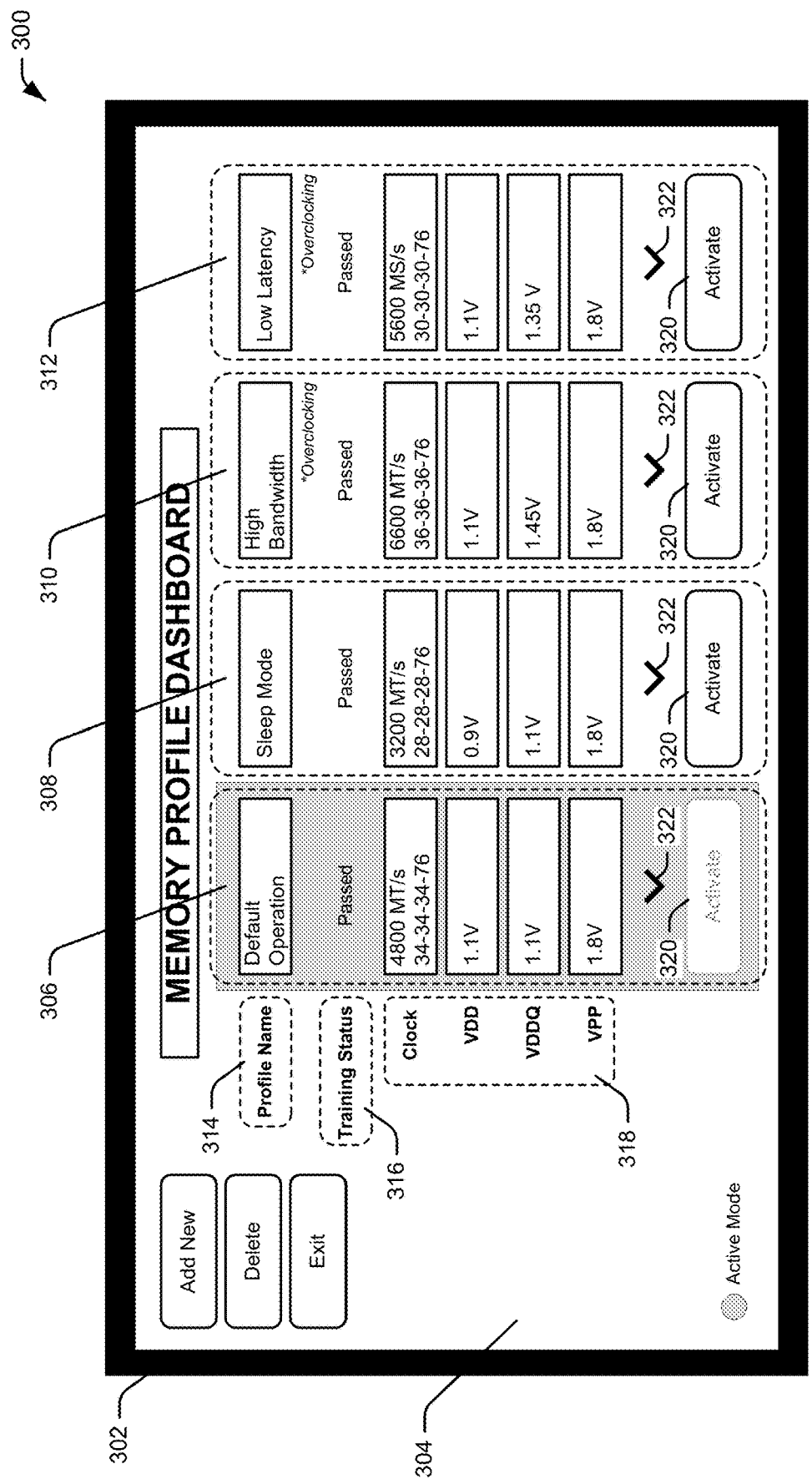
FIG. 3 depicts a non-limiting example of a user interface in one or more implementations.

FIG. 3 depicts a non-limiting example 300 of a user interface in one or more implementations. The example 300 includes a display device 302 outputting a memory overclocking user interface 304.

In the illustrated example 300, the user interface 304 is depicted displaying multiple memory profiles 306-312 according to which the memory 102 is operable. By way of example, the memory controller 104 trains the memory 102 with each of the memory profiles 306-312, e.g., during the training 206. In this example 300, the memory profile 306 and the memory profile 308 are non-overclocking memory profiles 112. In contrast, the memory profile 310 and the memory profile 312 are overclocking memory profiles 114, as indicated by "*Overclocking" indications in the illustrated example 300. In variations, memory profiles that are overclocking memory profiles are distinguished (e.g., visually) from non-overclocking memory profiles in a user interface in different ways.

In this example 300, each profile of the multiple memory profiles 306 includes a profile name 314 (or identifier), a training status 316, and a plurality of settings 318 according to which the memory 102 is operated when the respective profile controls operation of the memory 102. Here, the user interface 304 also includes a displayed control 320 in each of the multiple memory profiles 306 that is selectable to switch operation of the memory 102 to the respective profile. For instance, receipt of user input in relation to one of the displayed controls 320 corresponds to the request 118 to operate the memory 102 according to the respective profile. Responsive to receipt of such user input, the memory controller 104 thus switches to operating the memory 102 according to the respective profile.

In this example 300, the memory profile 306 corresponds to the active, in-use memory profile, e.g., the memory profile according to which the memory 102 is operating at the time the user interface 304 is displayed. This is represented in the example 300 with visual highlighting (e.g., a filled in box emphasizing the profile) and by configuring the respective displayed control 320 to indicate that it is not selectable (e.g., the element is grayed out). The displayed control 320 of the memory profile 306 is not selectable in this example 300 because the memory 102 is already being operated according to the memory profile 306. In contrast, the displayed controls 320 of the other memory profiles 308-312 are depicted indicating that the respective profiles are selectable (e.g., the elements are not grayed out), such that responsive to a user selection of a displayed control 320 the memory controller 104 switches the memory profile with which the memory 102 is operating to the selected profile.

Each of the illustrated profiles also includes a scroll element 322 in this example 300. The scroll element 322 represents that the profiles include values for more settings than those depicted, in at least one variation. As noted above, the memory profiles are configured to specify different settings for operating the memory 102 (e.g., in an overclocking mode) in various implementations. In one or more implementations, the user interface 304 is further configured to receive user input to modify one or more of the settings. For instance, the user interface 304 receives user input to modify clock settings of one or more of the memory profiles 306-312. In at least one such implementation, the memory controller 104, e.g., the firmware, allows the modification to be made as long as a modified setting is within a range with which the memory 102 was trained during the training 206, such that the memory 102 is known to be operable using the modified setting.

In one or more implementations, the user interface 304 includes at least one interface element (e.g., "Add New" button) that enables a user to add a new memory profile to the multiple memory profiles 306-312, such that the new memory profile includes one or more user-specified settings. When a user selects to activate such a new profile, e.g., with which the memory 102 has not yet been trained, the system 100 reboots to train the memory 102 with the new profile or, instead, reduces operation to a sleep state to train the memory 102 without rebooting. Examples of "sleep" states, that do not involve a reboot, include the ACPI global sleeping state, G1, in combination with any of the sleep states S0ix, S1, S2, S3, and S4.

In this example 300, the memory profile 306 corresponds to a default operating profile and is a non-overclocking memory profile 112, e.g., which causes the system 100 to operate in an ACPI global working state, G0. The memory profile 308 corresponds to an operating profile for a sleep mode of the system 100 and is also a non-overclocking memory profile 112. The memory profile 310 corresponds to a high-bandwidth overclocking memory profile 114 (e.g., for a productivity application), and the memory profile 312 corresponds to a low latency overclocking memory profile 114 (e.g., for gaming). It is to be appreciated that the non-overclocking memory profiles 112 and the overclocking memory profiles 114 include fewer, more, or different memory profiles than depicted in various implementations.

Figure 4:
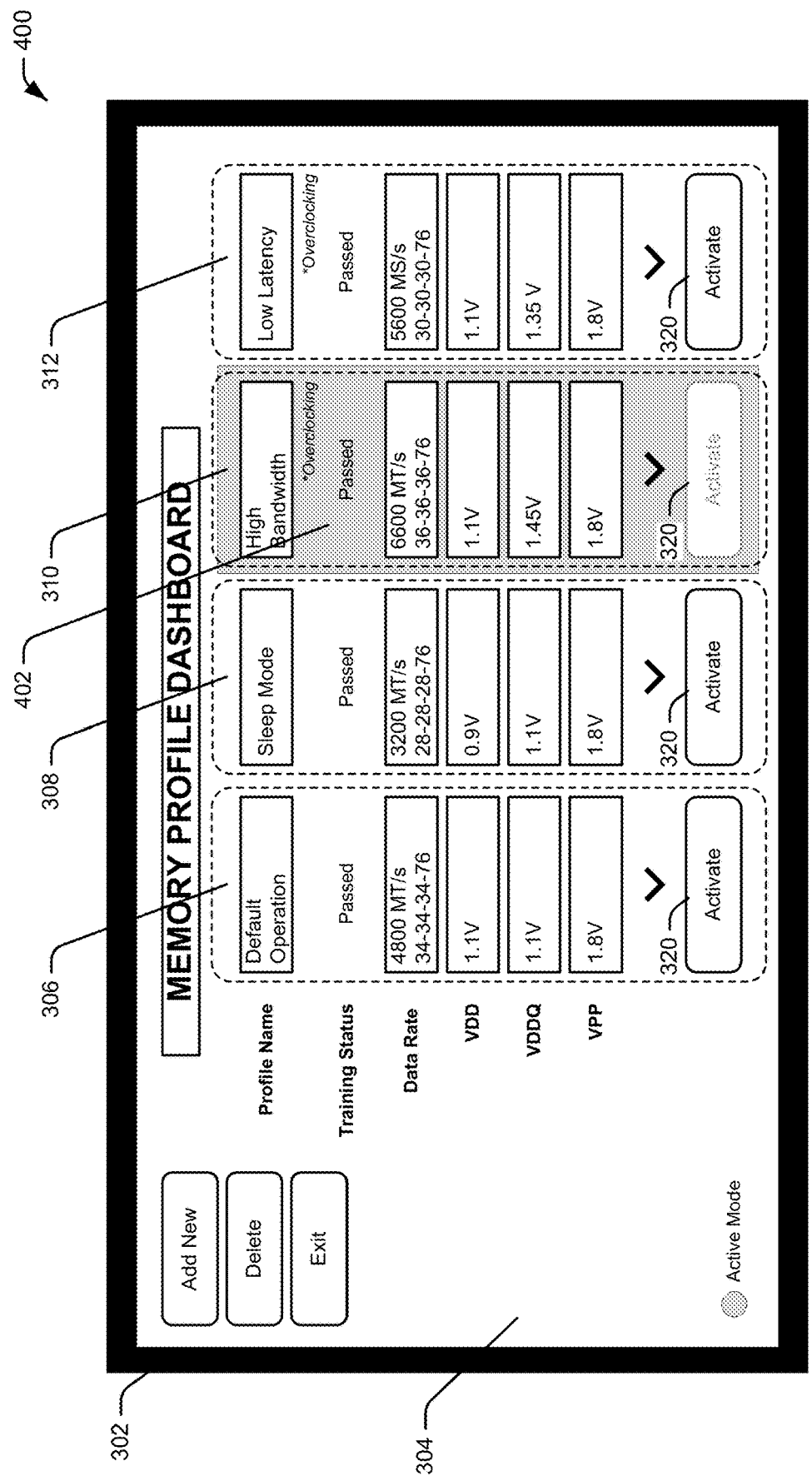
FIG. 4 depicts another non-limiting example of the user interface in one or more implementations.

FIG. 4 depicts another non-limiting example 400 of the user interface in one or more implementations. The example 400 includes from FIG. 3 the display device 302 displaying the user interface 304, which includes the memory profiles 306-312.

In this example 400, the memory profile 310 is depicted with visual emphasis 402 to indicate that the memory profile 310 is the active, in-use profile by the memory 102, e.g., at the time the user interface 304 is displayed in the example 400. Also in this example 400, the displayed control 320 of the memory profile 310 is visually configured (e.g., grayed out) to indicate that the memory profile 310 is not selectable, e.g., because the memory 102 is already being operated according to the memory profile 310. Notably, the memory profile 310 is an overclocking memory profile 114, indicating that the memory 102 operates in an overclocking mode at a time that corresponds to the illustrated example 400.

In contrast to the example depicted in FIG. 3, the memory profile 306 is not visually emphasized in the example 400. This is because the memory profile 306 is not the active, in-use memory profile in the example 400, e.g., it is no longer the active memory profile. Assuming that the example 400 corresponds to a time subsequent to the example depicted in FIG. 3, in accordance with the described techniques, the memory controller 104 has caused the memory 102 to switch from operating according to the memory profile 306 (a non-overclocking memory profile 112) to operating according to the memory profile 310 (an overclocking memory profile 114), without rebooting the memory 102 or the system 100 in connection with making the switch.

Figure 5:
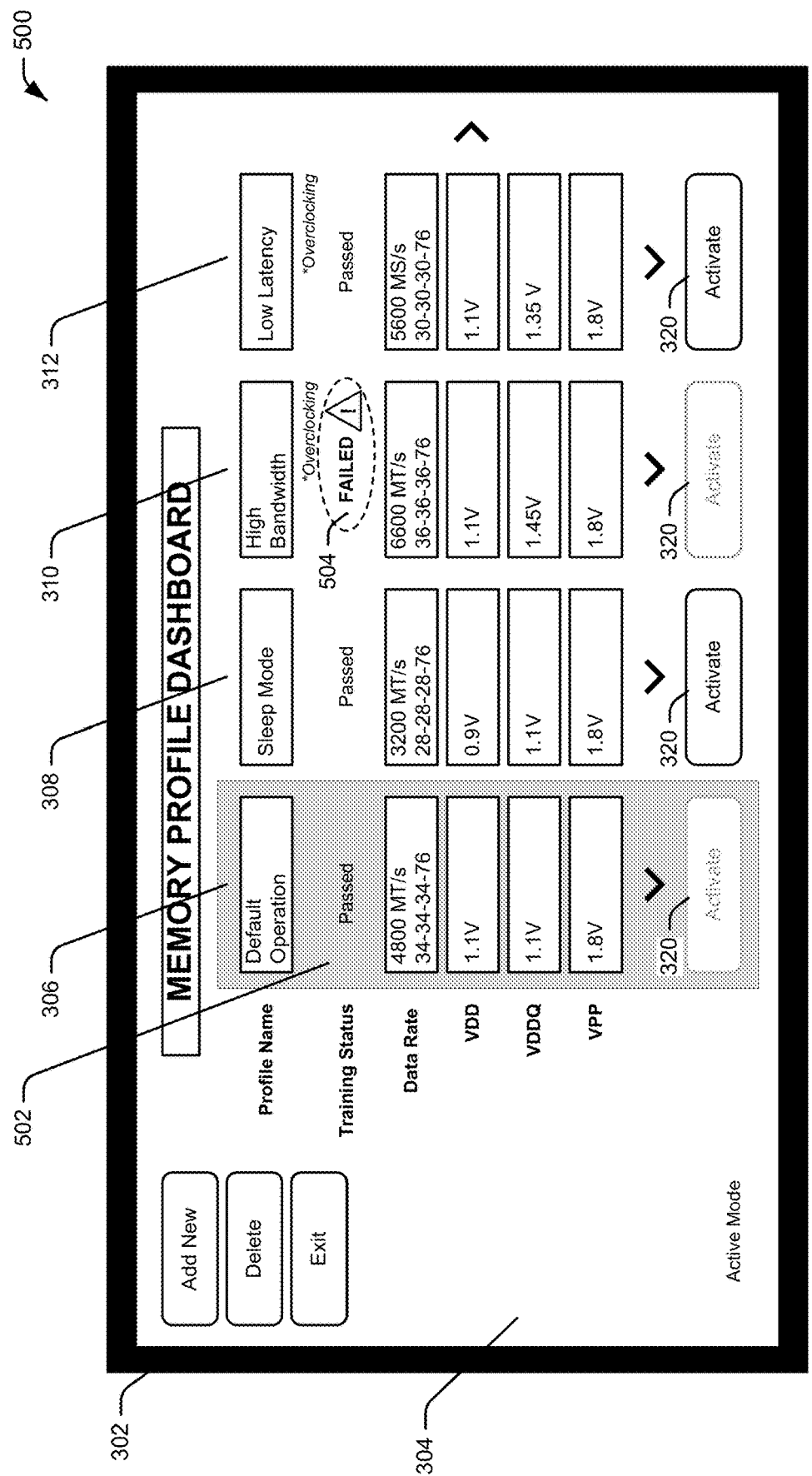
FIG. 5 depicts another non-limiting example of the user interface in one or more implementations.

FIG. 5 depicts another non-limiting example 500 of the user interface in one or more implementations. The example 500 includes from FIG. 3 the display device 302 displaying the user interface 304, which includes the memory profiles 306-312.

In this example 500, the memory profile 306 is depicted with visual emphasis 502 to indicate that the memory profile 306 is the active, in-use profile by the memory 102, e.g., at the time the user interface 304 is displayed in the example 500. Also in this example 500, the displayed control 320 of the memory profile 306 is visually configured (e.g., grayed out) to indicate that the memory profile 310 is not selectable, e.g., because the memory 102 is already being operated according to the memory profile 310.

In this example 500, the displayed element of the memory profile 310 is also visually configured (e.g., grayed out) to indicate that the respective memory profile 310 is not selectable. In contrast to not being selectable because it corresponds to an active, in-use profile, the displayed control 320 of the memory profile 310 is not selectable in this example 500 because the memory controller 104 has not made the memory profile 310 available for use by the memory 102. In particular, the example 500 represents a scenario where the memory profile 310 is not available because it failed the training 206. Here, the training status 316 of the memory profile 310 includes a failed training status 504 notification, which visually indicates that the memory profile 310 failed the training 206. As mentioned above, the memory controller 104 prevents switching to a memory profile that has failed training in one or more implementations. The memory controller 104 also causes or otherwise initiates output of the failed training status 504 notification.

Although the user interface 304 is depicted being displayed, in one or more implementations, a user interface that conveys information about a plurality of memory profiles with which a memory 102 is trained and that enables a user to modify, add, or select memory profiles for operation of the memory 102 is configured, at least in part, in various ways. In one or more implementations, for example, a user interface for interacting with a plurality of memory profiles is at least partially voice-based, e.g., the user interface receives voice commands and initiates actions based on those commands and/or the user interface audibly outputs information about the memory profiles. It is to be appreciated that user interfaces which enables interaction with multiple memory profiles, e.g., including enabling switching to operate with memory overclocking profiles without rebooting, are configured differently than depicted and discussed herein without departing from the spirit or scope of the described techniques.

Having discussed example systems and user interfaces for profile switching for memory overclocking, consider the following example procedures.

Figure 6:
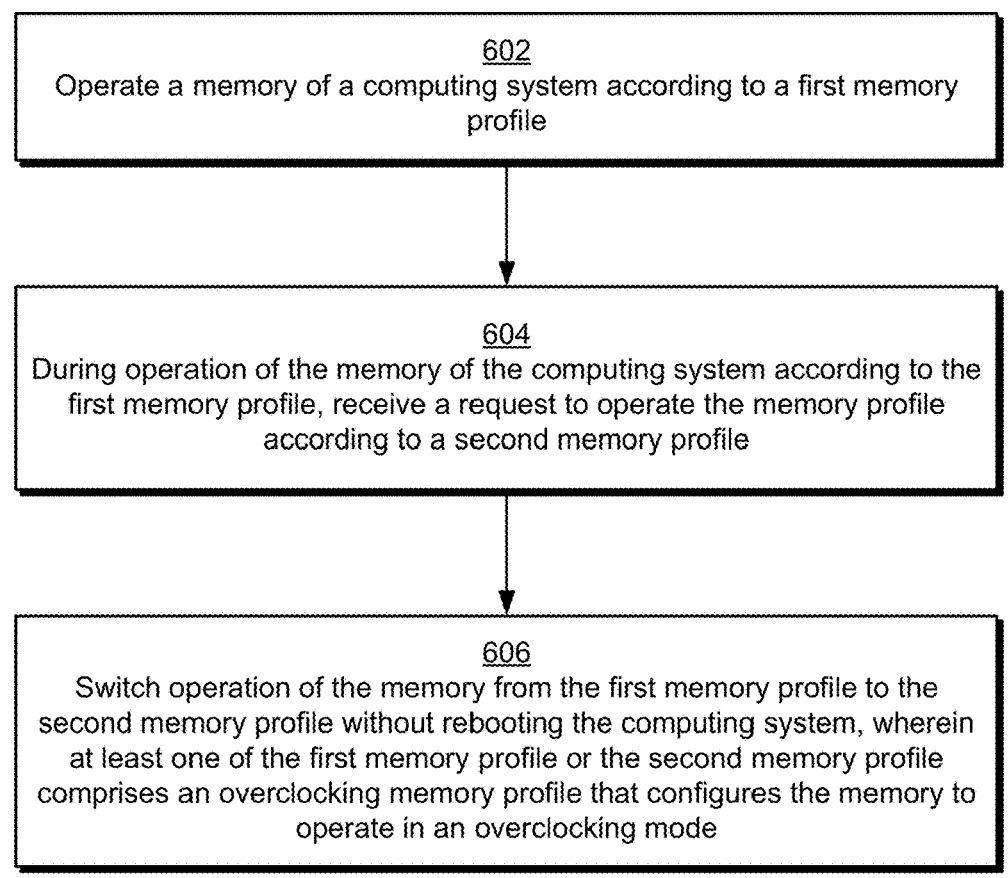
FIG. 6 depicts a procedure in an example implementation of switching operation of a memory from operating according to a first memory profile to operating according to a second memory profile without rebooting.

FIG. 6 depicts a procedure in an example 600 implementation of switching operation of a memory from operating according to a first memory profile to operating according to a second memory profile without rebooting.

A memory is operated according to a first memory profile (block 602). By way of example, a memory 102 is operated according to a first memory profile 208.

During operation of the memory according to the first memory profile, a request is received to operate the memory according to a second memory profile (block 604). By way of example, during operation of the memory 102 according to the first memory profile 208, a request 118 is received to switch to operating the memory 102 according to a second memory profile 210. In one example, the request 118 is based on user input. For instance, user input is received (e.g., via a user interaction or selection with a displayed element of a user interface) to activate the second memory profile 210. In another example, the request 118 is application based, such that an application (not shown) requests that the memory 102 activate the second memory profile 210 for execution of the application. By way of example, a computer game requests that the memory 102 switch to operating according to a memory profile which specifies settings for low latency, or a productivity application (e.g., photo or video editing application) requests that the memory 102 switch to operating according to a memory profile which specifies settings for high bandwidth.

Responsive to the request, operation of the memory is switched to operate according to the second memory profile without rebooting (block 606). In accordance with the principles discussed herein, at least one of the first memory profile or the second memory profile comprises an overclocking memory profile that configures the memory to operate in an overclocking mode. By way of example, responsive to the request 118, the memory controller 104 provides one or more switch memory profile 216 signals to the memory 102 to cause the memory 102 to switch to operating according to the second memory profile 210. At least one of the first memory profile 208 or the second memory profile 210 corresponds to an overclocking memory profile 114. As described throughout, an overclocking memory profile 114 specifies at least one setting for the memory 102 that exceeds a certified setting, e.g., a clock rate specified in an overclocking memory profile 114 exceeds the clock rate certified by a manufacturer of the memory 102. Broadly, an overclocking memory profile 114 enables the memory 102 to operate in an overclocking mode.

Figure 7:
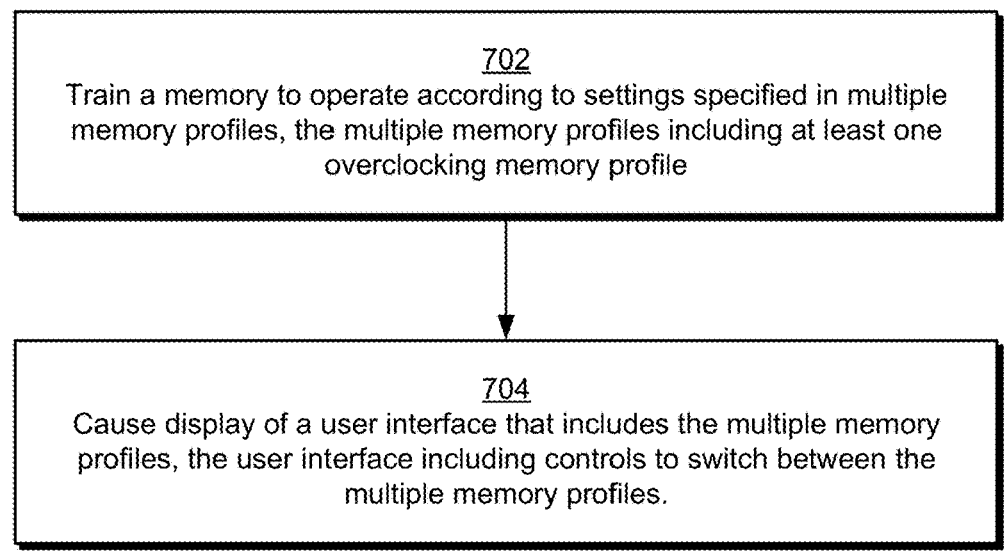
FIG. 7 depicts a procedure in an example implementation of training multiple memory profiles and causing display of a user interface that includes the multiple memory profiles.

FIG. 7 depicts a procedure in an example 700 implementation of training multiple memory profiles and causing display of a user interface that includes the multiple memory profiles.

A memory is trained to operate according to settings specified in multiple memory profiles (block 702). In accordance with the principles discussed herein, the multiple memory profiles include at least one overclocking memory profile. By way of example, the memory controller 104 and/or another component of the system 100 (e.g., physical layer (PHY)) train the memory 102 to operate according to multiple memory profiles which include at least one overclocking memory profile 114.

A user interface that includes the multiple memory profiles is displayed (block 704). In accordance with the principles discussed herein, the user interface includes controls to switch between the multiple memory profiles. By way of example, user interface 304 displays multiple memory profiles 306-312 according to which the memory 102 is operable. The multiple memory profiles 306-312 correspond to memory profiles which were previously trained by the memory controller 104 at block 702. The memory profile 306 and the memory profile 308 displayed in the user interface 304 correspond to non-overclocking memory profiles 112, while the memory profile 310 and the memory profile 312 correspond to overclocking memory profiles 114. The user interface 304 also includes a displayed control 320 in each of the multiple memory profiles 306 that is selectable to switch operation of the memory 102 to the respective profile. For instance, receipt of user input in relation to one of the displayed controls 320 corresponds to the request 118 to operate the memory 102 according to the respective profile. Responsive to receipt of such user input, the memory controller 104 thus switches to operating the memory 102 according to the respective profile.

It should be understood that many variations are possible based on the disclosure herein. Although features and elements are described above in particular combinations, each feature or element is usable alone without the other features and elements or in various combinations with or without other features and elements.

The various functional units illustrated in the figures and/or described herein (including, where appropriate, the memory 102, the memory controller 104, and the processing unit 106) are implemented in any of a variety of different manners such as hardware circuitry, software or firmware executing on a programmable processor, or any combination of two or more of hardware, software, and firmware. The methods provided are implemented in any of a variety of devices, such as a general purpose computer, a processor, or a processor core. Suitable processors include, by way of example, a general purpose processor, a special purpose processor, a conventional processor, a digital signal processor (DSP), a graphics processing unit (GPU), a parallel accelerated processor, a plurality of microprocessors, one or more microprocessors in association with a DSP core, a controller, a microcontroller, Application Specific Integrated Circuits (ASICs), Field Programmable Gate Arrays (FPGAs) circuits, any other type of integrated circuit (IC), and/or a state machine.

In one or more implementations, the methods and procedures provided herein are implemented in a computer program, software, or firmware incorporated in a non-transitory computer-readable storage medium for execution by a general purpose computer or a processor. Examples of non-transitory computer-readable storage mediums include a read only memory (ROM), a random access memory (RAM), a register, cache memory, semiconductor memory devices, magnetic media such as internal hard disks and removable disks, magneto-optical media, and optical media such as CD-ROM disks, and digital versatile disks (DVDs).

CONCLUSION

Although the systems and techniques have been described in language specific to structural features and/or methodological acts, it is to be understood that the systems and techniques defined in the appended claims are not necessarily limited to the specific features or acts described. Rather, the specific features and acts are disclosed as example forms of implementing the claimed subject matter.

What is claimed is:

1. A method comprising:
   training a memory to operate according to settings specified in a first memory profile and a second memory profile;
   operating the memory according to the first memory profile;
   during operation of the memory according to the first memory profile, receiving a request to operate the memory according to the second memory profile; and
   responsive to the request, switching operation of the memory to operate according to the second memory profile without rebooting, wherein at least one of the first memory profile or the second memory profile comprises an overclocking memory profile that configures the memory to operate in an overclocking mode.

2. The method of claim 1, wherein training the memory to operate according to the settings specified in the first memory profile and the second memory profile occurs during a boot up process.

3. The method of claim 1, wherein the first memory profile comprises a high bandwidth overclocking memory profile relative to the second memory profile.

4. The method of claim 1, wherein the first memory profile comprises a low latency overclocking memory profile relative to the second memory profile.

5. The method of claim 1, wherein the second memory profile comprises the overclocking memory profile.

6. The method of claim 1, wherein the first memory profile comprises the overclocking memory profile.

7. The method of claim 6, wherein the second memory profile comprises an additional overclocking memory profile.

8. The method of claim 1, further comprising displaying a user interface that includes the first memory profile and the second memory profile, the user interface including controls to switch between the first memory profile and the second memory profile.

9. A method comprising:
   training a memory to operate according to settings specified in multiple memory profiles, the multiple memory profiles including at least one overclocking memory profile; and
   causing display of a user interface that includes the multiple memory profiles, the user interface including controls to switch between the multiple memory profiles.

10. The method of claim 9, wherein the multiple memory profiles include at least a non-overclocking memory profile, a first overclocking memory profile with high bandwidth relative to the non-overclocking memory profile, and a second overclocking memory profile with low latency relative to the non-overclocking memory profile.

11. The method of claim 9, wherein training the memory to operate according to settings specified in multiple memory profiles occurs during a boot up process.

12. The method of claim 9, further comprising:
    receiving, via the controls of the user interface, user input to select one of the multiple memory profiles; and
    causing the memory to switch from operating according to an active memory profile to operating according to a selected memory profile.

13. The method of claim 12, wherein the memory switches from operating according to the active memory profile to operating according to the selected memory profile without rebooting.

14. The method of claim 9, further comprising detecting, during the training, that the memory is not capable of operating according to at least one of the multiple memory profiles.

15. The method of claim 14, further comprising displaying, in the user interface, a notification which visually indicates that the at least one of the multiple memory profiles failed the training.

16. The method of claim 14, further comprising preventing operation of the memory according to the at least one of the multiple memory profiles.

17. A computing device comprising:
    a memory; and
    a memory controller configured to train a memory to operate according to settings specified in a first memory profile and a second memory profile and cause the memory to switch from operating according to the first memory profile to operating according to the second memory profile without rebooting the computing device, wherein at least one of the first memory profile or the second memory profile comprises an overclocking memory profile.

18. The computing device of claim 17, wherein the memory comprises a double data rate 5 synchronous dynamic random-access memory.

19. The computing device of claim 17, further comprising a processing unit that requests access to data from the memory.

20. The computing device of claim 17, wherein the second memory profile comprises the overclocking memory profile.

\* \* \* \* \*